United States Patent
Fujimori

(10) Patent No.: US 11,362,209 B2
(45) Date of Patent: Jun. 14, 2022

(54) GATE POLYSILICON FEED STRUCTURES FOR TRENCH DEVICES

(71) Applicant: SEMICONDUCTOR COMPONENTS INDUSTRIES, LLC, Phoenix, AZ (US)

(72) Inventor: Reiki Fujimori, Aizuwakamatsu (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 57 days.

(21) Appl. No.: 16/589,479

(22) Filed: Oct. 1, 2019

(65) Prior Publication Data
US 2020/0335624 A1 Oct. 22, 2020

Related U.S. Application Data

(60) Provisional application No. 62/834,642, filed on Apr. 16, 2019.

(51) Int. Cl.
*H01L 29/78* (2006.01)
*H01L 29/66* (2006.01)
*H01L 29/423* (2006.01)

(52) U.S. Cl.
CPC ...... *H01L 29/7827* (2013.01); *H01L 29/4236* (2013.01); *H01L 29/66666* (2013.01)

(58) Field of Classification Search
CPC ......... H01L 24/05; H01L 24/03; H01L 24/13; H01L 2224/02206; H01L 2224/02215; H01L 2224/03019; H01L 2224/03614; H01L 2224/0401; H01L 2224/05082; H01L 2224/05166; H01L 2224/13026; H01L 2924/04941; H01L 2924/05432
See application file for complete search history.

(56) References Cited

U.S. PATENT DOCUMENTS

| | | | | |
|---|---|---|---|---|
| 10,263,070 | B2* | 4/2019 | Su | H01L 29/4236 |
| 2003/0222297 | A1* | 12/2003 | Krumrey | H01L 29/7397 |
| | | | | 257/302 |
| 2006/0157779 | A1* | 7/2006 | Kachi | H01L 29/66734 |
| | | | | 257/E29.136 |
| 2010/0163972 | A1* | 7/2010 | Saggio | H01L 29/0634 |
| | | | | 257/328 |
| 2011/0042742 | A1 | 2/2011 | Bhalla et al. | |
| 2013/0037853 | A1* | 2/2013 | Onozawa | H01L 29/0839 |
| | | | | 257/139 |
| 2013/0307060 | A1 | 11/2013 | Wang et al. | |
| 2014/0264569 | A1* | 9/2014 | Yedinak | H01L 29/7811 |
| | | | | 257/330 |
| 2015/0263162 | A1* | 9/2015 | Nishiguchi | H01L 29/404 |
| | | | | 257/331 |

(Continued)

*Primary Examiner* — Peter Bradford
(74) *Attorney, Agent, or Firm* — Brake Hughes Bellermann LLP

(57) ABSTRACT

In a general aspect, an apparatus, can include a trench disposed within a semiconductor region of a substrate. The trench can be lined with a gate dielectric and including an electrode disposed within the trench. The apparatus can include a polysilicon layer disposed above the trench. The trench can have an end portion disposed below an opening in the polysilicon layer. The end portion of the trench can be disposed between a first side of the opening and a second side of the opening.

20 Claims, 15 Drawing Sheets

(56) References Cited

U.S. PATENT DOCUMENTS

| | | | |
|---|---|---|---|
| 2015/0303294 A1* | 10/2015 | Sakata | H01L 29/0696 |
| | | | 257/330 |
| 2018/0358347 A1* | 12/2018 | Jeong | H01L 27/0924 |
| 2019/0386106 A1* | 12/2019 | Kumada | H01L 21/76816 |
| 2020/0083338 A1* | 3/2020 | Kinoshita | H01L 29/7803 |
| 2020/0083369 A1* | 3/2020 | Kobayashi | H01L 29/0696 |
| 2020/0119147 A1* | 4/2020 | Kinoshita | H01L 29/4236 |
| 2020/0258979 A1* | 8/2020 | Tokuda | H01L 29/66734 |
| 2020/0294989 A1* | 9/2020 | Okumura | H01L 29/7803 |

* cited by examiner

US 11,362,209 B2

GATE POLYSILICON FEED STRUCTURES FOR TRENCH DEVICES

RELATED APPLICATION

This application claims priority to the and the benefit of U.S. Provisional Application No. 62/834,642, filed on Apr. 16, 2019, which is incorporated herein by reference in its entirety.

TECHNICAL FIELD

This relates, generally, to a gate poly feed structures for trench devices.

BACKGROUND

The characteristics of a semiconductor device, such as a Metal-oxide-semiconductor field-effect transistor (MOSFET) device, can affect device performance in an adverse fashion. Some MOSFET devices can have at least a gate electrode disposed within a dielectric filled trench that functions as a gate dielectric. MOSFET devices having, for example, gate dielectric layers that are thinned in some areas due to manufacturing processes and/or device layout can be problematic for at least some device applications. Thus, a need exists for systems, methods, and apparatus to address the shortfalls of present technology and to provide other new and innovative features.

SUMMARY

In a general aspect, an apparatus, can include a trench disposed within a semiconductor region of a substrate. The trench can be lined with a gate dielectric and including an electrode disposed within the trench. The apparatus can include a polysilicon layer disposed above the trench. The trench can have an end portion disposed below an opening in the polysilicon layer. The end portion of the trench can be disposed between a first side of the opening and a second side of the opening.

DETAILED DESCRIPTION

A trench transistor device (e.g., a Metal-oxide-semiconductor field-effect transistor (MOSFET) device, a low voltage (LV) MOSFET device) can have a gate electrode disposed within a trench lined with a gate dielectric layer (e.g., a gate oxide layer, a high-K dielectric layer). The layouts of the transistor devices described herein address issues with portions of gate dielectric layers within a trench that may otherwise be weak (e.g., thin) in some areas. For example, the transistor device layouts described herein address potential issues with a gate dielectric layer that can be particularly weak in a top portion of a trench and/or a bottom portion of the trench. Specifically, gate polysilicon feed layouts for the trench transistor devices described herein can be configured to address the potential issues with weak points in gate dielectric layers.

As a specific example, the trench transistor devices described herein avoid thinning of gate dielectric layers that can occur due to manufacturing processes and/or device layout that can be problematic for at least some device applications (e.g., battery applications). Thinning of the gate dielectric layer on top and/or bottom portions of a trench can cause gate oxide integrity (GOI) issues. A transistor device with a striped trench pattern layout can be susceptible to gate dielectric layer thinning at end portions (e.g., tips) of the trenches (e.g., trench bottoms and/or facets (on both sides of the trench)). Wider trench patterns (e.g., ladder trench patterns) can mitigate thinning at the end portions of the trenches. However, these wider trench pattern designs can result in gate thinning at other locations within the trenches such as along the top corners of trenches (e.g., along the top sidewalls of the trenches). The gate polysilicon feed layouts for the trench transistor devices described herein can be configured to address the gate thinning issues at the end portions of the trenches and/or at other locations within the trenches including the top corners of trenches.

Figure 1A:
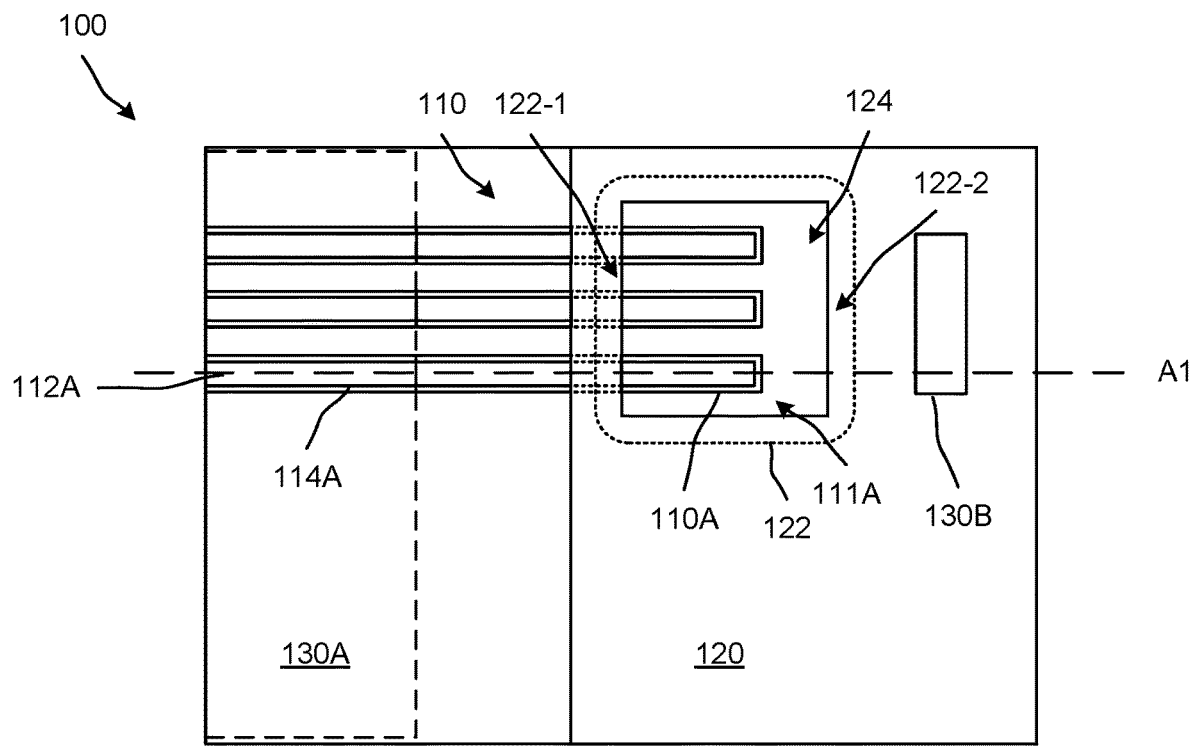
FIGS. 1A and 1B are views of transistor device, in accordance with implementations described herein.

FIG. 1A illustrates a plan view of a layout of a portion of a transistor device 100 according to at least one implementation. In FIG. 1A (and in many of the drawings throughout), some dielectric layers are not shown to simplify the plan view and highlight the elements.

As shown in FIG. 1A, the transistor device 100 includes a trench 110A (from multiple parallel trenches 110 or a set of trenches 110) with an electrode 112A (e.g., a gate electrode) lined with a trench dielectric 114A (e.g., a gate dielectric, a gate oxide). The end portion 111A (e.g., a tip) of the trench 110A terminates within (e.g., below, vertically below) an opening 124 (e.g., an area of an opening) within a polysilicon layer 120. The polysilicon layer 120 defines a polysilicon ring 122 (e.g., a gate polysilicon ring depicted by the dashed line) around the end portion 111A of the trench 110A. The polysilicon layer 120 is directly coupled (e.g., electrically coupled) to the electrode 112A (which can also be made of polysilicon) in the trench 110A. A contact opening 130B through which a metal layer 191 (shown in FIG. 1B) (e.g., a portion of a metal layer) is coupled to (e.g., directly coupled to) polysilicon layer 120 (via a polysilicon contact (not labeled)), is shown. Accordingly, the contact opening 130B is in fluid communication with the electrode 112A via the polysilicon ring 122 (or a portion thereof). In some implementations, the polysilicon ring 122 can be configured to minimize a resistance (e.g., an Rg increment) associated with the gate (e.g., gate switching). Although the description is with respect to trench 110A from the set of trenches 110, the principles described herein can be applied to one or more of the trenches 110.

As shown in FIG. 1A, the end portion 111A of the trench 110A terminates between two sides of the polysilicon ring 122 (or opening 124 within the polysilicon layer 120). Specifically, as shown in FIG. 1A, a first side 122-1 (or first edge) of the polysilicon ring 122 is disposed on a first side of the end portion 111A of the trench 110A, and a second side 122-2 of the polysilicon ring 122 is disposed on a second side of the end portion 111A. In some implementations, the end portion 111A can be centered between the first side 122-1 and the second side 122-2 of the polysilicon ring 122. The first side 122-1 of the polysilicon ring 122 can be coupled to (e.g., electrically coupled to) the electrode 112A (e.g., gate electrode).

As shown in FIG. 1A, the first side 122-1 of the polysilicon ring 122 is disposed over (e.g., above) a portion of the trench 110A, and the second side 122-2 is not disposed over any portion of the trench 110A. The remaining sides (not labeled, third side, fourth side) of the polysilicon ring 122 (between the sides 122-1 and 122-2) are aligned parallel with the trench 110A.

Although the polysilicon ring 122 has a rectangular profile (or substantially rectangular profile) as shown in FIG. 1A. In some implementations, the polysilicon ring 122 can have a different shape or profile. For example, in some implementations, polysilicon ring 122 can have a square profile, can have a rectangular profile with rounded corners, and so forth. In some implementations, the polysilicon ring 122 can have a circular shape, oval shape, and/or so forth.

In some implementations, a length (a longitudinal link) of one or more of the trenches 110 can be different. In such implementations, one of the trenches 110 can terminate at a different distance (or location) between the first side 122-1 and the second side 122-2 of the polysilicon ring 122 than another of the trenches 110.

In some implementations, at least a portion of the trenches 110 can be disposed within an active area of the transistor device 100. In some implementations, at least a portion (e.g., the end portions) of the trenches 110 can be disposed within a termination area of the transistor device 100. For example, polysilicon ring 122 and end portion 111A of the trench 110A can be disposed within a termination area of the transistor device 100. In some implementations, at least a portion (e.g., an active portion) of a source region can be disposed between (e.g., within a mesa region between) a pair of the trenches 110.

In some implementations, a width of each of the trenches 110 can be on the order of a few microns (e.g., 5 μm, 10 μm, 16 μm, 20 μm). The width can be a dimension perpendicular to a longitudinal length of the trenches 110. As shown in FIG. 1A, contact opening 130B can have a longitudinal length (from top to bottom of the figure) that is aligned perpendicular to a longitudinal length (from left to right of the figure (and orthogonal to the widths)) of the set of trenches 110.

Figure 1B:
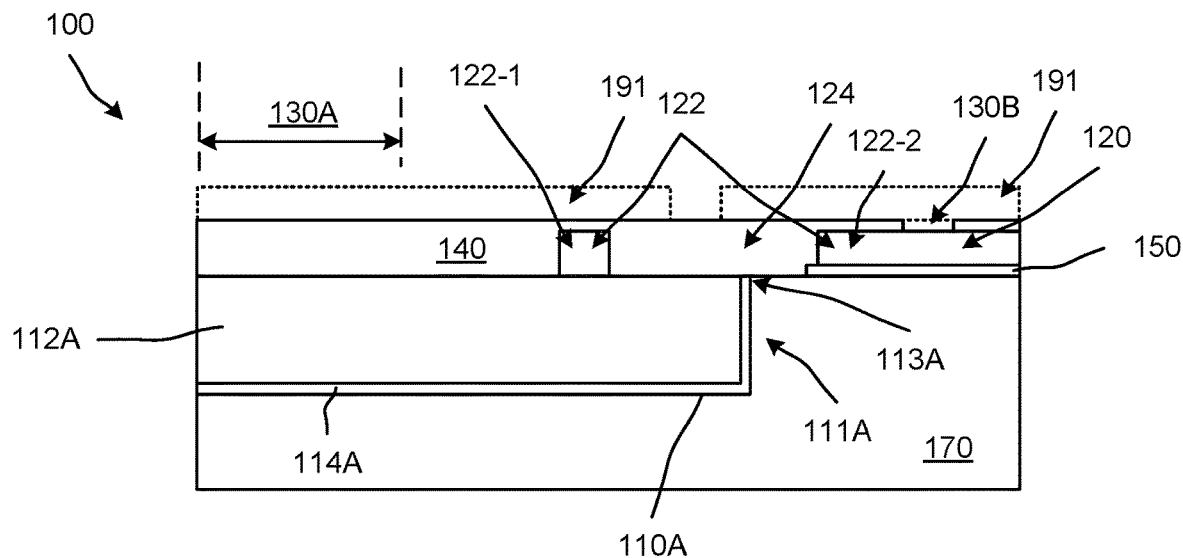

FIG. 1B is a side cross-sectional view of the transistor device 100 shown in FIG. 1A cut along line A1. As shown in FIG. 1B, the end portion 111A of the trench 110A terminates below (within an area projected below) the opening 124 within the polysilicon layer 120. In other words, the end portion 111A of the trench 110A is disposed below a plane aligned with the bottom of the polysilicon ring 122. Accordingly, a corner 113A of the trench 110A is below (e.g., vertically below) the opening 124 within the polysilicon layer 120. The polysilicon ring 122 is disposed around (but on a layer above) the end portion of 111A of the trench 110A. As shown in FIG. 1B, a first side 122-1 (or first edge) of the polysilicon ring 122 (or opening 124 within the polysilicon layer 120) is disposed on a first side of the end portion 111A of the trench 110A, and a second side 122-2 of the polysilicon ring 122 is disposed on a second side of the end portion 111A.

As shown in FIG. 1B, the contact opening 130B is coupled to the polysilicon layer 120. In this implementation, the polysilicon layer 120 is insulated from a substrate 170 by a dielectric layer 150 (also can be referred to as a polysilicon-insulating dielectric layer). In some implementations, the dielectric layer 150 can be formed using local oxidation of silicon (e.g., can be a LOCOS layer). In some implementations, dielectric layer 150 can be a relatively thick dielectric to avoid electrostatic discharge (ESD) and/or reliability risks due to contact etch damage during manufacturing.

In this implementation, an active region 130A (which can be a contact opening area to the trenches 110) is shown and a metal layer 191 (which can be part of the same metal layer above contact opening 130B) is insulated from the electrode 112A by a dielectric 140. In some implementations, the metal layer 191 can be, or can have, a metal contact to a source region within a mesa region (not shown) between trenches 110 of an active portion within the active region 130A of the transistor device 100. Gate dielectrics are not explicitly shown in all of the figures, but gate dielectrics are lining the trenches in each of the implementations described herein.

Figure 2:
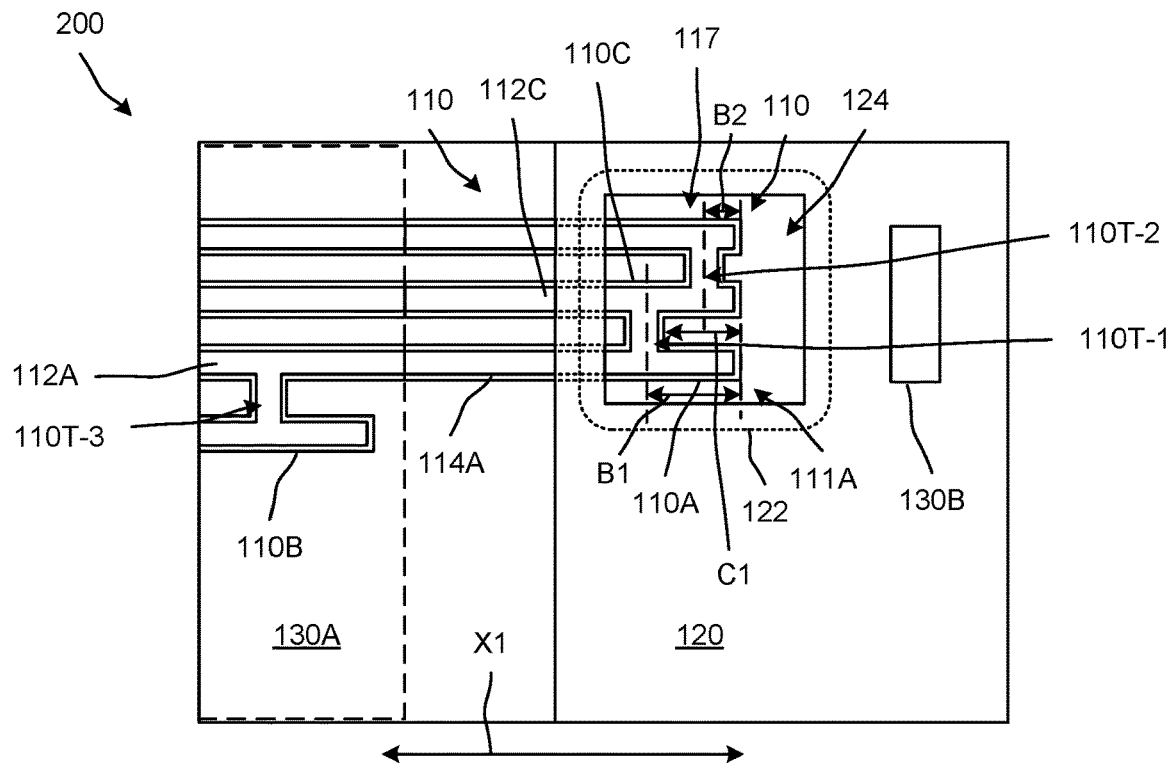
FIGS. 2 through 5 illustrate transistor devices that are variations of the transistor device shown in FIGS. 1A and 1B.

FIG. 2 illustrates a transistor device 200 that is a variation of the transistor device 100 shown in FIGS. 1A and 1B. The principles described in connection with FIG. 2 can be applied to any of the implementations described herein.

The transistor device 200 shown in FIG. 2 includes a set of trenches 110 that has a ladder portion 117 with a ladder pattern. The ladder portion 117 of the trenches is disposed within the opening 124 within the polysilicon layer 120. The ladder portion 117 includes transverse trenches 110T (e.g., transverse trench 110T-1 and transverse trench 110T-2) that are coupled (e.g., have electrodes that are electrically coupled with electrodes) between the trenches 110. For example, the transverse trench 110T-1 is disposed between and coupled between the trenches 110C and 110A. The trench 110C includes an electrode 112C that is electrically coupled to the electrode 112A of the trench 110A via transverse trench 110T-1.

The transverse trenches 110T, in this implementation, are aligned perpendicular to (orthogonal to) a longitudinal length of the parallel trenches 110. To define the ladder pattern, the transverse trenches 110T are offset along the longitudinal lengths of the trenches 110. For example, the first transverse trench 110T-1 between a first pair of trenches 110A, 110C is at a first longitudinal distance or length along the trenches 110. The second transverse trench 110T-2 between a second pair of trenches (including trench 110C) is at a second longitudinal distance or length along the trenches 110. Said differently the first transverse trench 110T-1 between a first pair of trenches 110A, 110C is at a first distance B1 from an end of the trenches 110A, 110C. The second transverse trench 110T-2 between a second pair of trenches (including trench 110C) is a second distance B2 from an end of the second pair of trenches (including trench 110C). The transverse trenches 110T-1 and 110T-2 can be referred to as being recessed (e.g., setback from the ends of the trenches 110).

As shown in FIG. 2, an end section of each of the trenches from the set of trenches 110 extends (e.g., away from the active region 130A, toward the contact opening 130B) beyond the transverse trenches 110T. In other words, one or more of the transverse trenches 110T can be recessed from the ends of one or more of the trenches 110. For example, an end section of trench 110A (having length C1) extends beyond the transverse trench 110T-1, and an end section of trench 110C (length not labeled) extends beyond the transverse trench 110T-2. The end section of the trench 110A extending beyond transverse trench 110T-1 has a length that is different than a length of the end section of the trench 110C extending beyond the transverse trench 110T-2.

In some implementations, the transverse trenches 110T can be aligned so that the distances B1 and B2 are aligned or the same (or equal). In such implementations, the end sections of the set of trenches 110 extending beyond the transverse trenches 110T will be the same or equal. The transverse trenches 110T-1 and 110T-2 can be referred to as being non-recessed (e.g., non-setback or aligned from the ends of the trenches 110).

In some implementations, one or more of the transverse trenches 110T can be aligned with one or more ends of one or more of the trenches 110 so that the end sections are excluded. In other words, one or more of the transverse trenches 110T may not be recessed from the one or more ends of one or more of the trenches 110.

Also, as shown in FIG. 2, the trenches 110 includes a trench 110B that terminates below the active region 130A. The trench 110B is shorter (e.g., shorter longitudinally) than the trench 110A. The trench 110B terminates before the polysilicon layer 120. In other words, the trench 110B terminates outside (e.g., outside of an area of) of the polysilicon layer 120 (or polysilicon pattern). Although not shown in FIG. 2, connection to the trench 110B are outside of the polysilicon layer 120 (or polysilicon pattern). The trench 110B is coupled (e.g., respective electrodes are electrically coupled) to the trench 110A via a transverse trench 110T-3. The trench 110B, which terminates outside of the area of the polysilicon layer 120 is electrically coupled via the transverse trench 110T-3 while the remainder of the trenches 110 that terminate within the area of the polysilicon layer 120 are electrically coupled via the polysilicon layer 120. The transverse trench 110T-3 can be recessed from the trench 110B. Accordingly, the trench 110B can have an end section that extends beyond (toward the polysilicon layer 120) the trench 110T-3.

Trenches such as trench 110B that are shorter than the remainder of the parallel trenches 110 that terminated within the polysilicon layer 120 can be referred to as staggered trenches. The trench 110B is staggered from ends of the remaining trenches 110 (can be referred to as full-length trenches) by a distance X1. Although not shown in this implementation, the staggered trenches can be disposed between sets of the parallel trenches that are longer than the staggered trenches.

Although not shown in FIG. 2, the transistor device 200 can include a polysilicon dielectric. Also, although not shown, the transverse trench 110T-3 coupled between 110A and 110B can be at an end of the trench 110B. In the words, the trench 110B may not be recessed from the trench 110T-3. In such implementations, the transverse trench 110T-3 can be referred to as an end trench (or as an end transverse trench). Although not shown in all of the implementations herein, the transverse trenches can be implemented as end trenches in any of the implementations.

Figure 3:
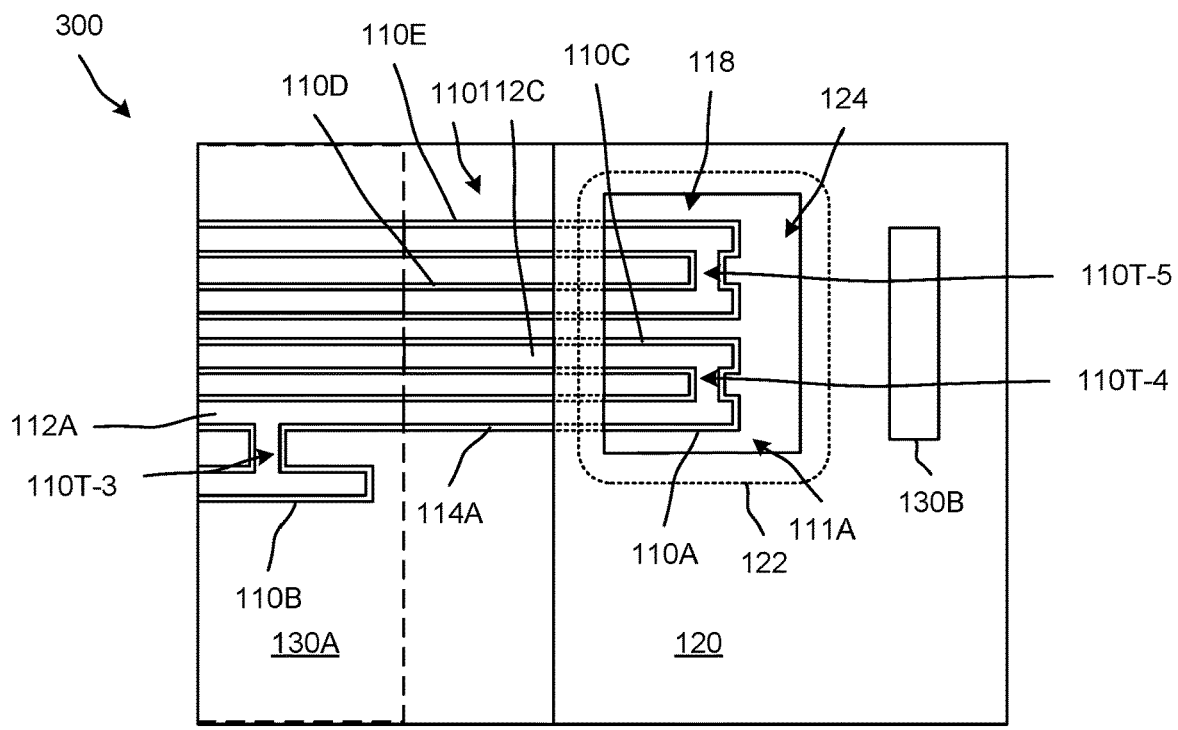

FIG. 3 illustrates a transistor device 300 that is a variation of the transistor device 100 shown in FIGS. 1A and 1B. The principles described in connection with FIG. 3 can be applied to any of the implementations described herein.

The transistor device 300 shown in FIG. 3 includes a set of trenches 110 that has an H-shape portion 118 with H-shaped patterns. For example, trenches 110A and 110C are coupled via a transverse trench 110T-4 to define an H-shape pattern, and trenches 110D and 110E are coupled via a transverse trench 110T-5 to define an H-shape pattern. The H-shaped patterns (and transverse trenches 110T-4, 110T-5 therein) are disposed within an area of the opening 124 within a polysilicon layer 120 (e.g., polysilicon ring 122). In this implementation, the transverse trenches 110T-4, 110T-5 are aligned (e.g., aligned along the same line). In some implementations, the transverse trenches 110T-4, 110T-5 may not be aligned along the same line.

In this implementation, pairs of trenches that define an H-shape are not coupled via a transverse trench. In other words, a transverse trench is excluded between pairs of trenches. In this implementation, a transverse trench is excluded between trenches 110C and 110D (which are adjacent trenches). These H-shaped pairs of trenches are coupled electrically via the polysilicon layer 120 (e.g., the polysilicon ring 122). Although not shown in FIG. 3, the transistor device 300 can include a polysilicon dielectric and/or different types of transverse trenches.

Figure 4:
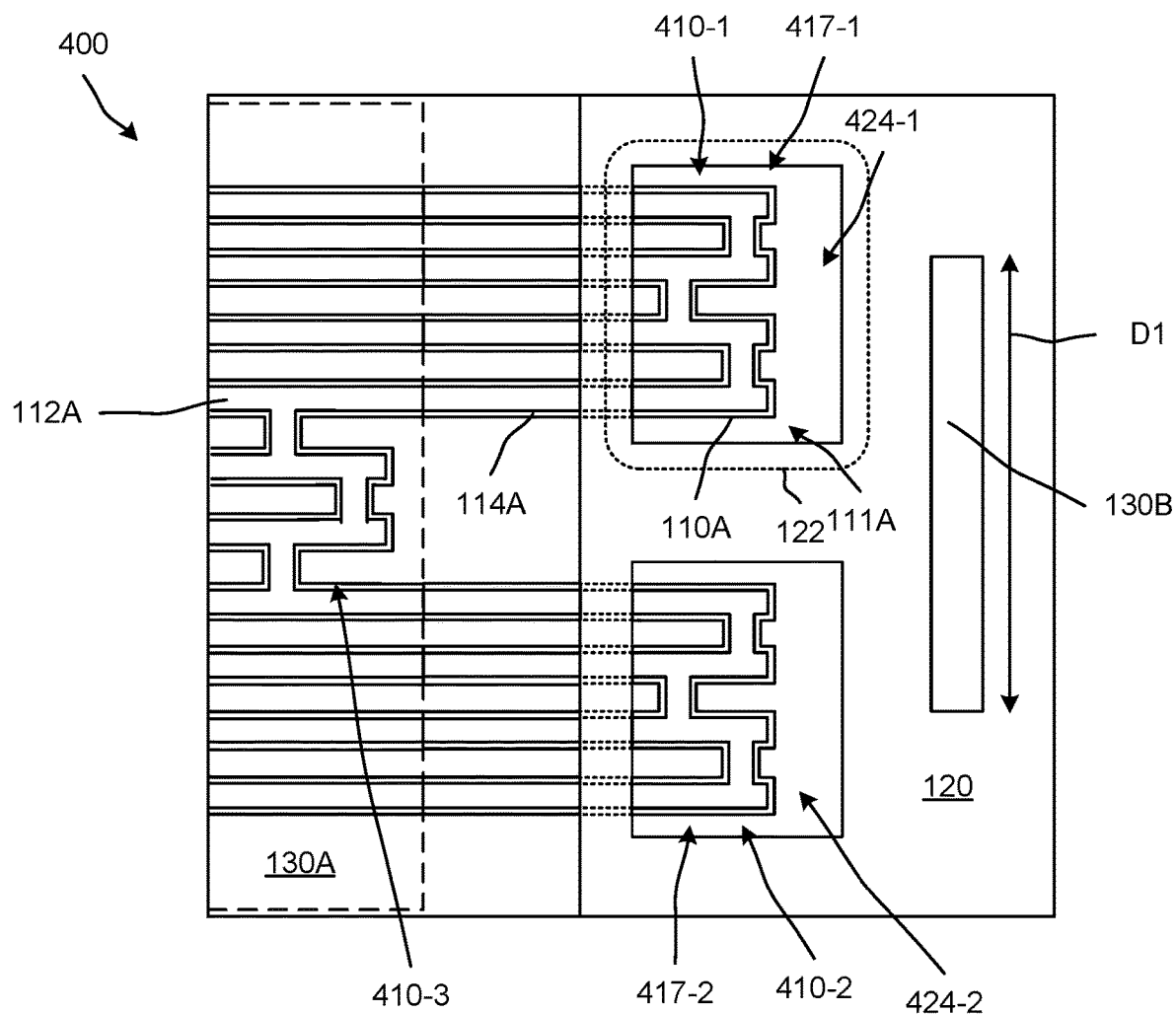

FIG. 4 illustrates a transistor device 400 that is a variation of the transistor device 100 shown in FIGS. 1A and 1B. The principles described in connection with FIG. 4 can be applied to any of the implementations described herein.

The transistor device 400 shown in FIG. 4 includes a first set of trenches 410-1 that has a ladder portion 417-1 and a second set of trenches 410-2 that has a ladder portion 417-2. The ladder portion 417-1 of the first set of trenches 410-1 is associated with (e.g., disposed below) a first opening 424-1 in the polysilicon layer 120, and the ladder portion 417-2 of the second set of trenches 410-1 is associated with (e.g., disposed below) a second opening 424-2 in the polysilicon layer 120. Some of the transverse trenches within the ladder portion 417-1 are aligned along the same line and are parallel to at least one other transverse trench. The transverse trenches within the ladder portion 417-2 are configured in the same fashion as those in ladder portion 417-1.

In this implementation, a third set of trenches 410-3 is coupled via transverse trenches (e.g., a ladder pattern). The third set of trenches 410-3 can be staggered trenches. In this implementation, all of the third set of trenches 410-3 are coupled via transverse trench to other trenches within the third set of trenches 410-3 or are coupled via a transverse trench to the first set of trenches 410-1 or the second set of trenches 410-2. Accordingly, the third set of trenches 410-3 (or staggered trenches) are disposed between the sets of trenches 410-1 and 410-2. The transverse trenches associated with the third set of trenches are disposed below the active region 130A. Although not shown in FIG. 4, the transistor device 400 can include a polysilicon dielectric and/or different types of transverse trenches (e.g., end trenches).

In this implementation, all of the trenches 410-1, 410-2, and 410-3 are coupled via transverse trenches. In some implementations at least some pairs of adjacent trenches may not be coupled via a transverse trench. For example, at least some of the trenches 410-1 may not be coupled via a transverse trench within the opening 424-1, and/or at least some of the trenches 410-2 may not be coupled via a transverse trench within the opening 424-2.

As shown in FIG. 4, contact opening 130B has a length D1. The contact opening 130B spans between the openings 424-1 and 424-2. In other words, the length D1 of contact opening 130B is longer than a spacing between the openings 424-1 and 424-2. The length D1 of the contact opening 130B allows for better electrical connection to the devices associates with the openings 424-1 and 424-2.

Figure 5:
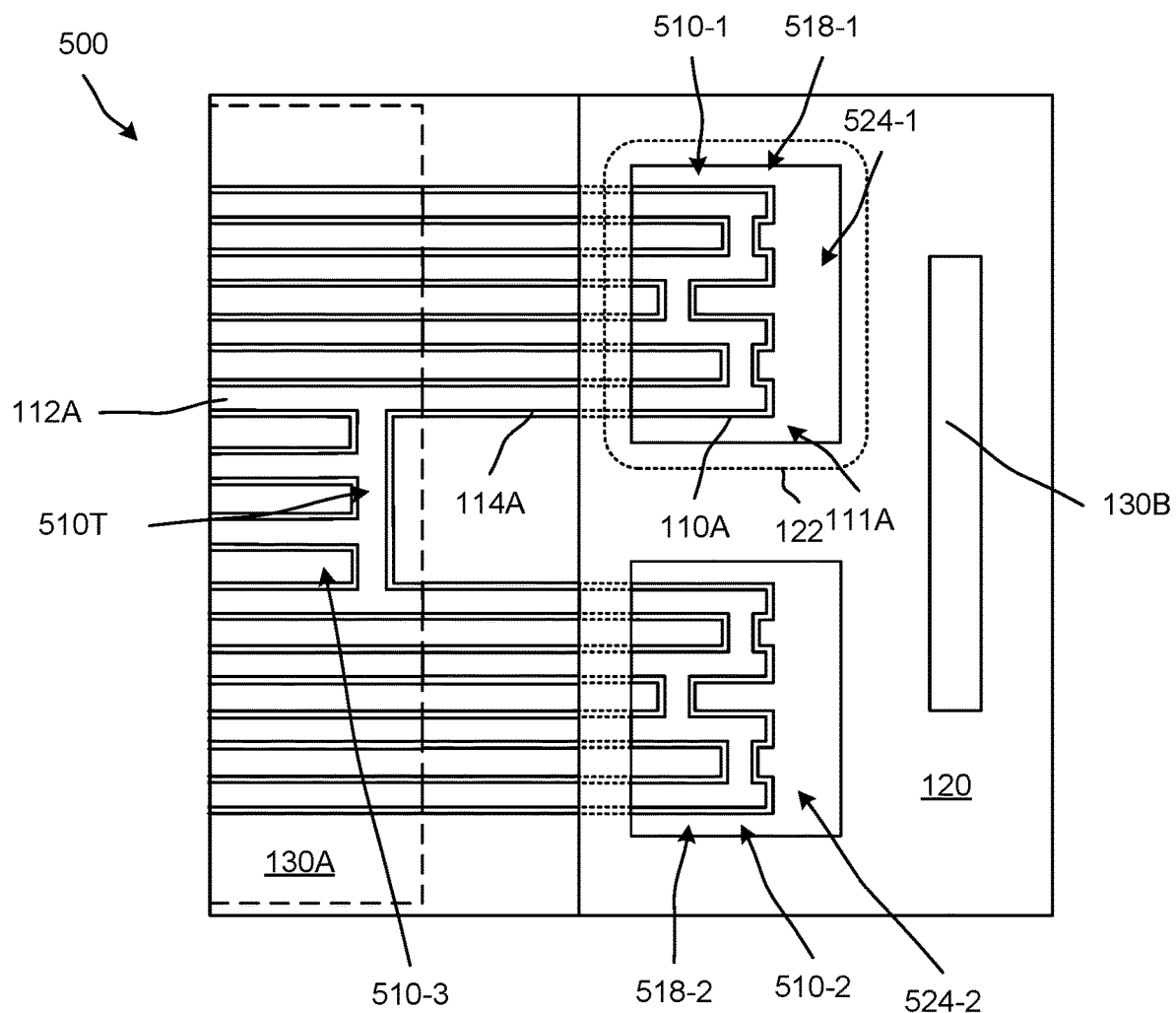

FIG. 5 illustrates a transistor device 500 that is a variation of the transistor device 100 shown in FIGS. 1A and 1B. The transistor device 500 includes many of the features shown in FIG. 4.

The transistor device 500 shown in FIG. 5 includes a first set of trenches 510-1 that has an H-shape portion 517-1 and a second set of trenches 510-2 that has an H-shape portion 517-2. The H-shape 517-1 of the first set of trenches 510-1 is associated with (e.g., disposed below) a first opening 524-1 in the polysilicon layer 120, and the H-shape 517-2 of the second set of trenches 510-1 is associated with (e.g., disposed below) a second opening 524-2 in the polysilicon layer 120. In this implementation, a third set of trenches 510-3 (e.g., staggered trenches 510-3) is coupled via a transverse trench 510T that is an end trench (e.g., a transverse end trench). Although not shown in FIG. 5, the transistor device 500 can include a polysilicon dielectric and/or different types of transverse trenches.

Figure 6:
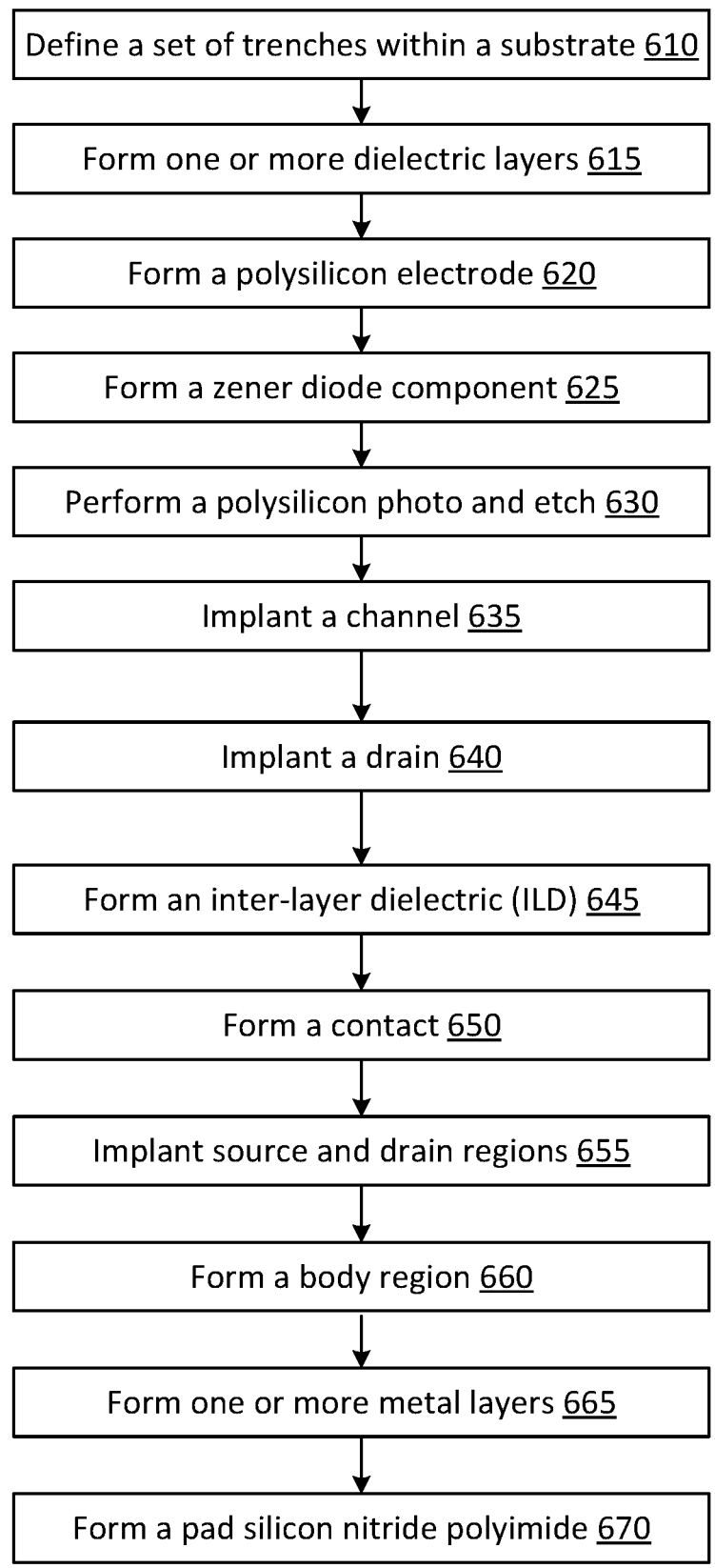
FIG. 6 is a diagram that illustrates a method of making the transistor devices described herein.

FIG. 6 is a diagram that illustrates a method of making the transistor devices described herein. As shown in FIG. 6, a set of trenches can be formed within a substrate (block 610). In some implementations, the set of trenches can be formed using a hard mask (also can be referred to as a hard mask dielectric layer).

Figure 7A:
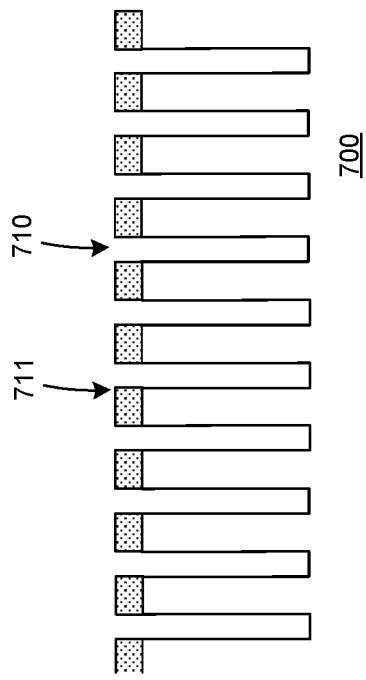
FIGS. 7A through 9D illustrate portions of the method shown in FIG. 6.
Figure 7B:
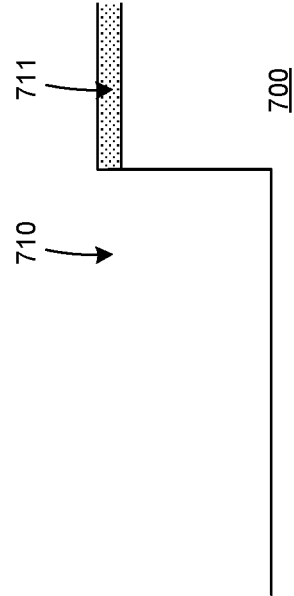
Figure 7C:
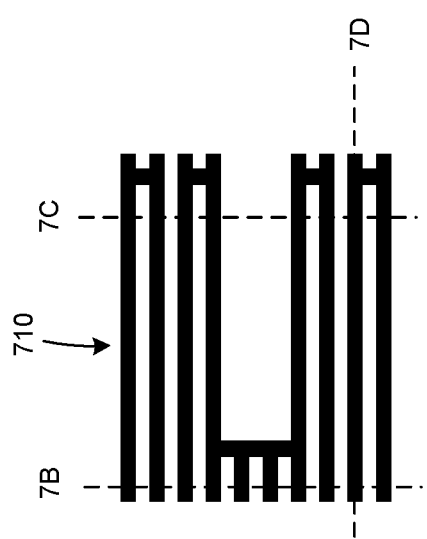
Figure 7D:
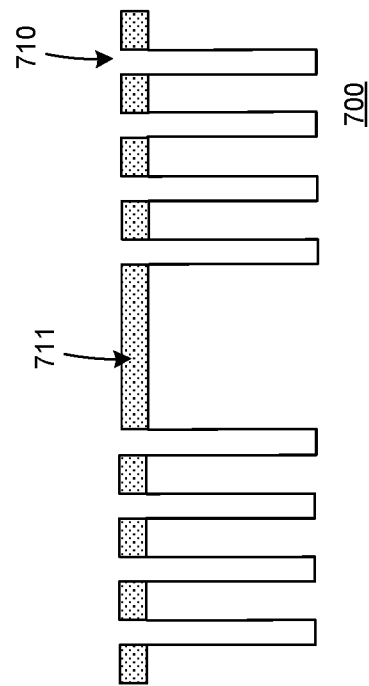

FIGS. 7A through 7D illustrate the trench module process in block 610 of FIG. 6. Specifically, FIG. 7A illustrates a plan view of a trench structure 710 (also can be referred to as trenches or as a set of trenches) including H-shaped portions, staggered trenches, a transverse end trench, and/or so forth. FIGS. 7B through 7D are cross-sectional views of the trench structure 710 cut along lines 7B through 7D, respectively. The trench structure 710 is formed in this implementation using a hard mask 711 within a substrate 700.

As shown in FIG. 6, one or more dielectric layers can be formed (block 615). The dielectric layers can include, for example, a sacrificial oxide layer, a gate oxide layer, and/or so forth. One or more of the dielectric layers can line the surface of the set of trenches.

As shown in FIG. 6, a polysilicon electrode can be formed in the set of trenches (block 620). The electrode can be, for example, a gate electrode. As shown in FIG. 6, a Zener diode component (or module) can also be formed (block 625). As shown at block 630, a polysilicon photo and etch process can be performed.

Figure 8B:
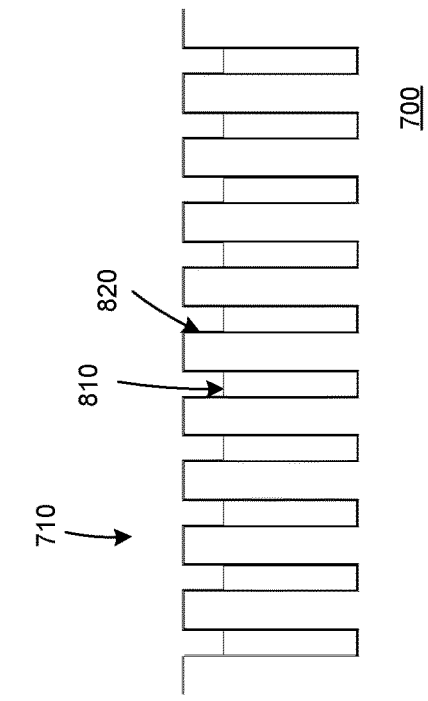
Figure 8A:
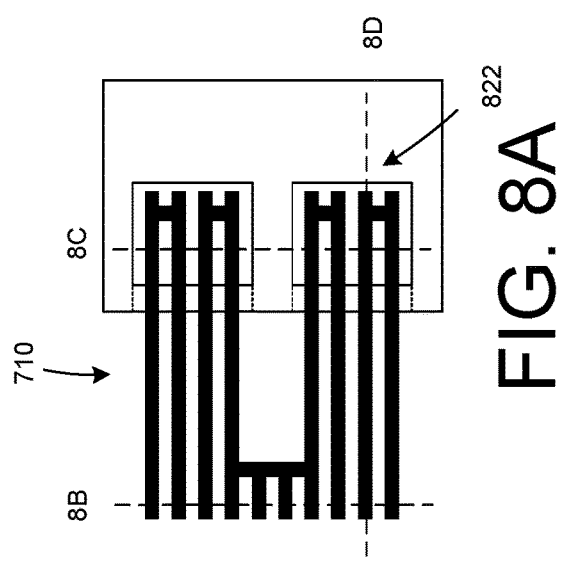
Figure 8D:
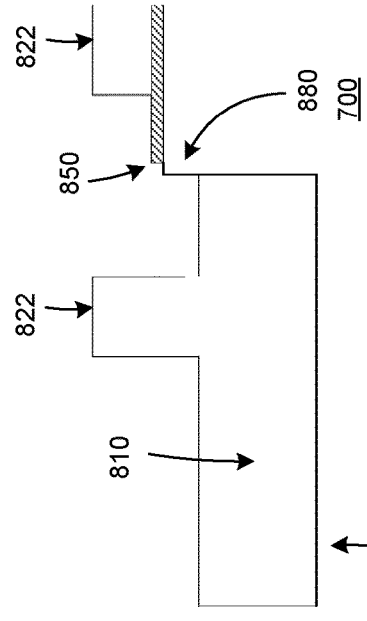
Figure 8C:
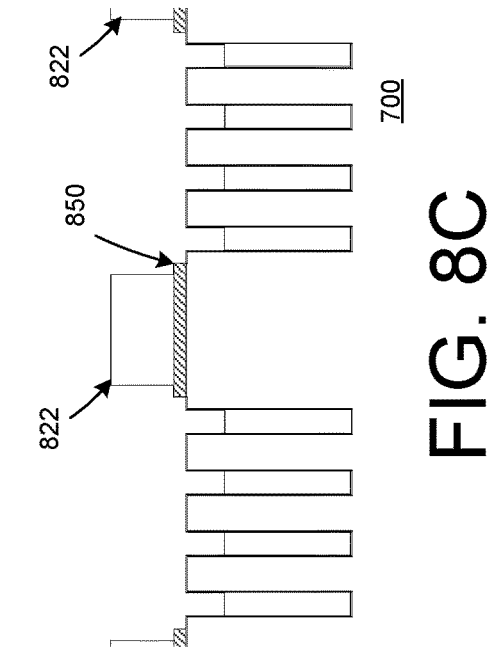

FIGS. 8A through 8D illustrate the poly photo/etch process in block 630 of FIG. 6. Specifically, FIG. 8A illustrates a plan view of the trench structure 710 with a gate polysilicon 810 and a gate oxide (or dielectric) 820 lining the trench structure 710. FIGS. 8B through 8D are cross-sectional views of the trench structure cut along lines 8B through 8D, respectively. As shown in FIGS. 8A through 8D, a polysilicon ring 822 (e.g., a gate polysilicon ring) is formed on a hard mask 850 (or dielectric layer). FIG. 8D illustrates the polysilicon ring 822 making contact (e.g., poly contact) with the gate polysilicon 810. As shown in FIG. 8D, no gate poly 810 is disposed on the tip of the trench (e.g., a trench from the set of trench structure 710) at location 880.

As shown in FIG. 6, multiple additional structures can be formed using a variety of process. For example, a channel can be implanted (block 635), a drain is implanted (e.g., a lightly doped drain, a N-type lightly doped drain) (block 640), an inter-layer dielectric (ILD) (e.g., inter-metal dielectric layer) can be formed (block 645), a contact can be formed (e.g., contact photo and etch) (block 650), source and drain regions can be formed (e.g., a second N-type source and drain implant, a second source and drain implant) (block 655), a body region can be formed (block 660), one or more metal layers (e.g., metal layer 191 shown in FIGS. 1A and 1B, metal layer 991A, 991B shown in FIGS. 9B, 9D) can be formed (block 665), and/or a pad silicon nitride (SiN) and/or polyimide can be formed (block 670).

Figure 9B:
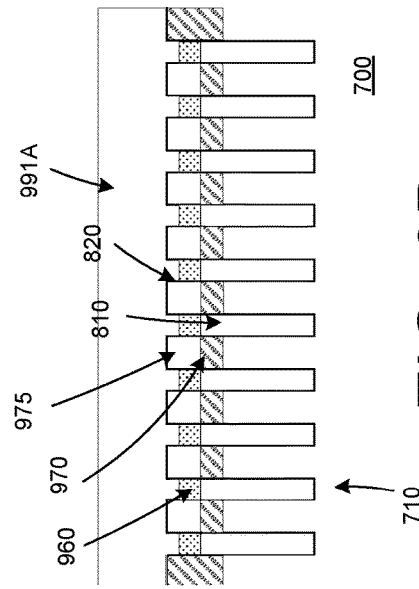
Figure 9D:
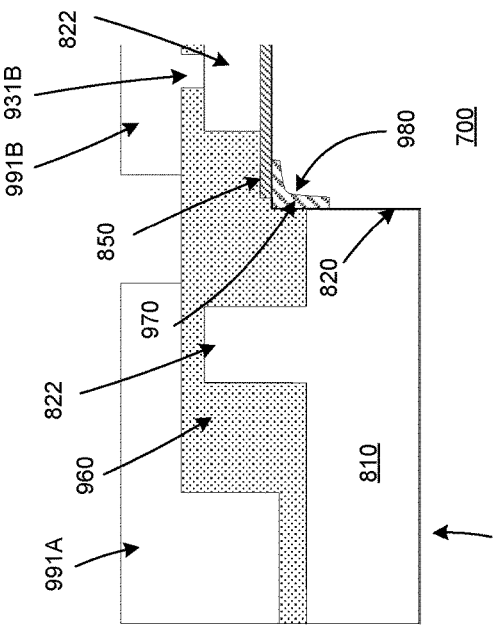
Figure 9A:
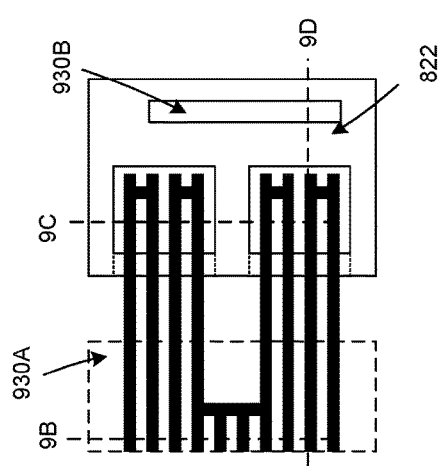
Figure 9C:
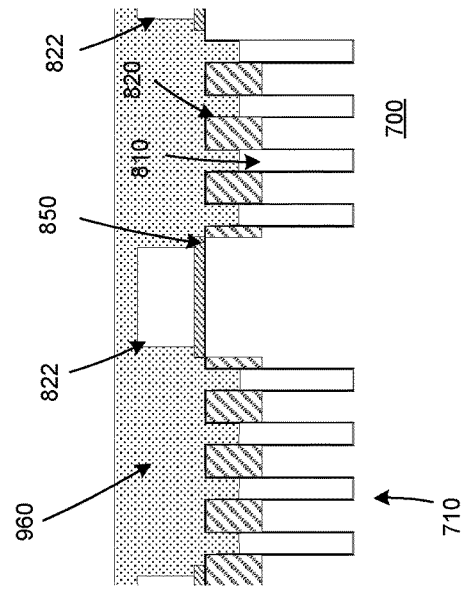

FIGS. 9A through 9D illustrate at least some of structures associated with the processes of blocks 635 through 665. Specifically, FIG. 9A illustrates a plan view of a metal layer on the trench structure 710. FIGS. 9B through 9D are cross-sectional views of the structure cut along lines 9B through 9D, respectively.

FIG. 9A illustrates an active area 930A. FIGS. 9B through 9D illustrate an inter-layer dielectric layer 960 insulating features from a metal layers 991A, 991B (shown in FIGS. 9B and 9D). The metal layer 991B is contacted to the polysilicon ring 822 via a poly contact 931B in contact opening 930B. The channel 970 and source/drain regions 975 are illustrated in at least FIG. 9B. As shown in FIG. 9D, no gate poly is disposed on the tip of the trench (e.g., a trench from the set of trench structure 710) at location 980. As shown in FIG. 9D, the channel implant 970 penetrates the hard mask 850 and then is diffused via a thermal process.

In at least one implementation, a method of forming the devices described herein can include, for example, forming a trench disposed within a semiconductor region of a substrate where the trench is lined with a gate dielectric and includes an electrode disposed within the trench. The method can include forming a polysilicon layer disposed above the trench where the trench has an end portion disposed below an opening in the polysilicon layer, and the end portion of the trench is disposed between a first side of the opening and a second side of the opening.

In another implementation, a method of forming the devices described herein can include, for example, forming a pair of trenches disposed within a semiconductor region of a substrate where each of the pair of trenches is lined with a gate dielectric and includes an electrode disposed within each of the pair of trenches. The method can include forming a polysilicon layer disposed above the pair of trenches where each of the pair trenches has an end portion disposed below an opening in the polysilicon layer, and the pair of trenches are joined by a transverse trench disposed within the opening.

In yet another implementation, a method of forming the devices described herein can include forming a trench disposed within a semiconductor region of substrate where the trench can be lined with a gate dielectric and can include an electrode disposed within the trench. The method can include forming a polysilicon layer disposed above the trench and defining a ring where the ring has a first portion disposed above and insulated from the trench. The first portion of the ring can be disposed on a first side of an end the trench. The method can also include forming a metal contact (through a contact opening) in direct contact with a second portion of the ring where the second portion of the ring is disposed on a second side of the end of the trench opposite the first side of the end of the trench.

Figure 10A:
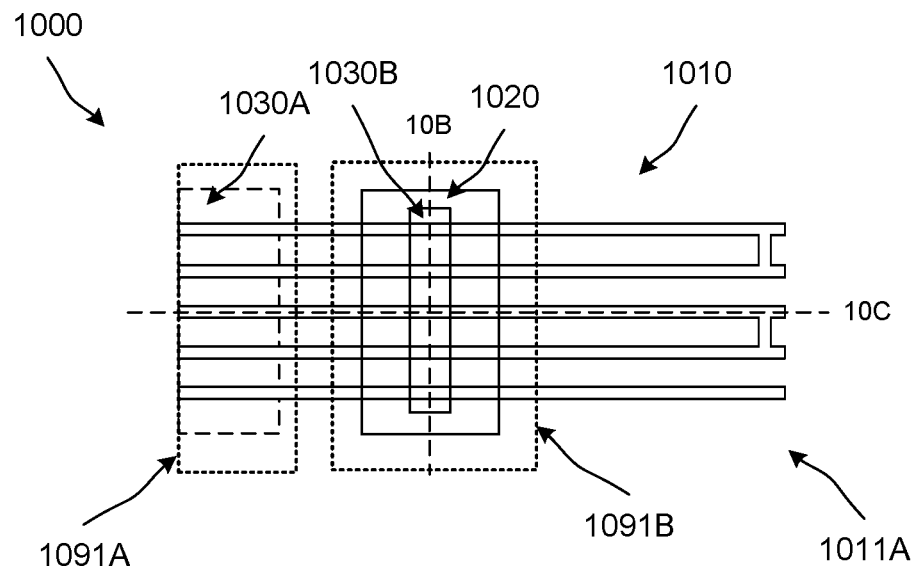
FIGS. 10A, 10B, 10C, and 11 illustrate additional transistor device variations of the transistor device shown in FIGS. 1A and 1B.
Figure 10B:
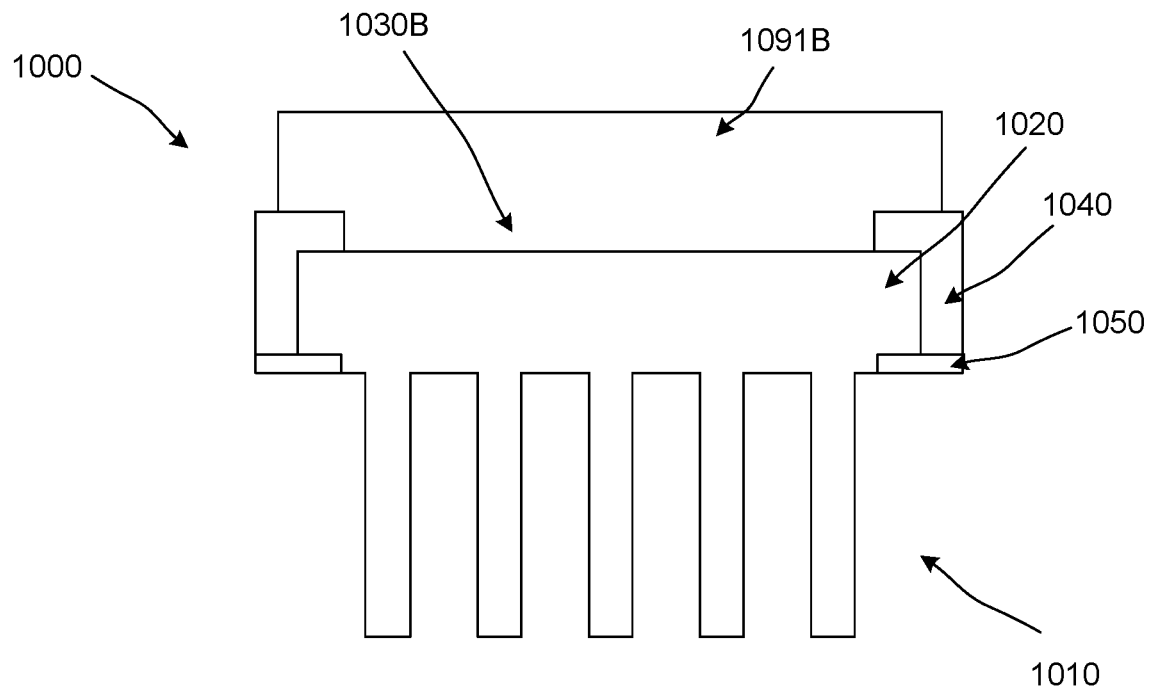
Figure 10C:
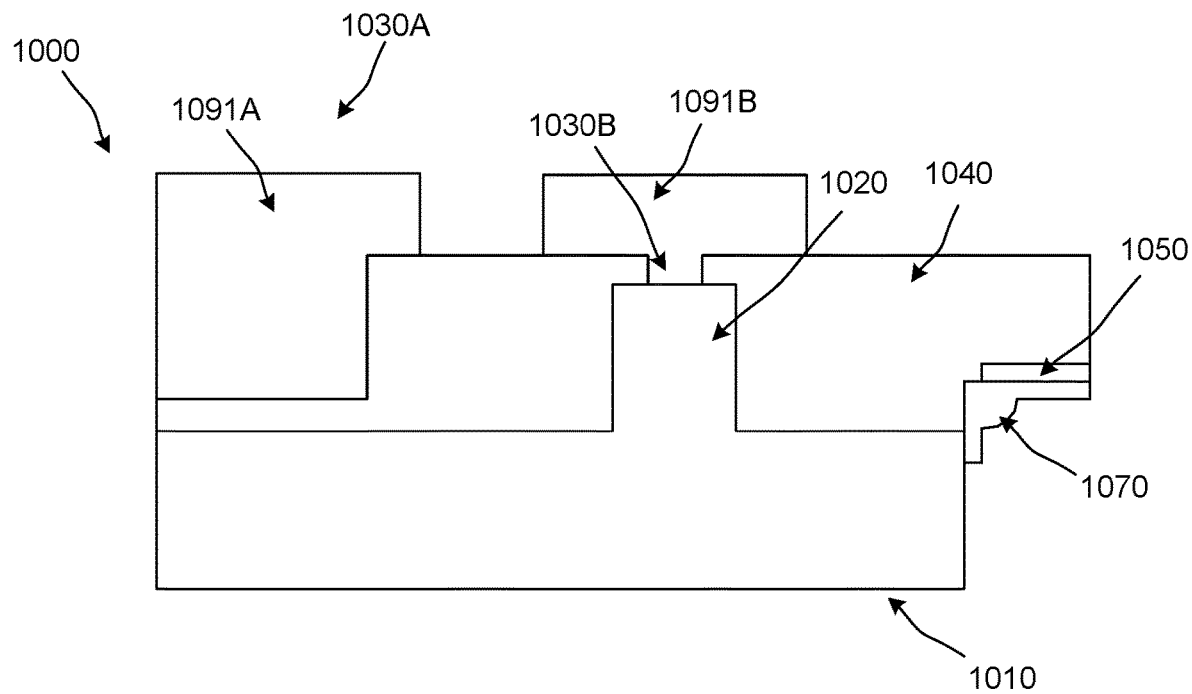

FIGS. 10A through 10C illustrates a transistor device 1000 that is a variation of the transistor device 100 shown in FIGS. 1A and 1B. This transistor device 1000 incorporates and/or can incorporate many of the feature described above in connection with other implementations.

In this implementation, the end portions 1011A of the trenches 1010 extend beyond and are not disposed below (e.g., are disposed outside of) a polysilicon layer 1020. FIG. 10A excludes a polysilicon ring structure. Contact opening 1030B (through which a metal layer 1091B can be contacted) and an active region 1030A (through which a metal layer 1091A can be contacted) are shown. In this implementation, the trenches 1010 include H-shaped portions. An H-shaped portion is excluded from one of the parallel trenches. In some implementations, other types of structures (e.g., ladder, U-shape (not shown)) can be implemented at the end portions 1011A of the trenches 1010. Metal layers 1091A and 1091B are shown in FIG. 10A. The polysilicon layer 1020 is shown as a solid line in FIG. 10A even though the trenches 1020 are below the polysilicon layer 1020 (views in FIGS. 11 through 14D are shown in a similar fashion).

FIG. 10A shows lines 10B, which corresponding with the cross-section in FIG. 10B, and line 10C, which corresponds with the cross-section in FIG. 10C. FIG. 10B illustrates metal layer 1091B contacted with polysilicon layer 1020 an electrically connected to the polysilicon in the trenches 1010 via the contact opening 1030B. FIG. 10B also illustrates a dielectric layer 1040 and hard mask 1050. FIG. 10C illustrates a cross-section along the length of one of the trenches 1010. A channel implant 1070 (e.g., a channel region) is illustrated in FIG. 10C.

Figure 11:
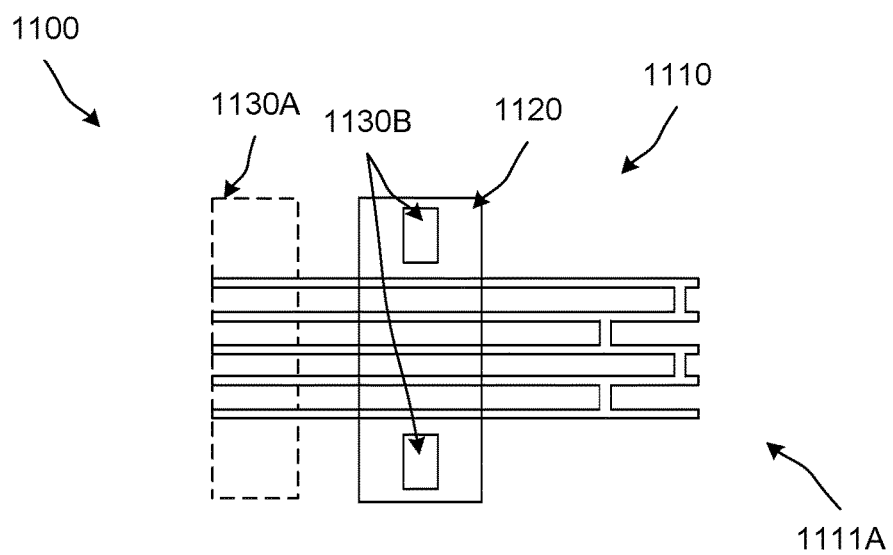

FIG. 11 illustrates a transistor device 1100 that is a variation of the transistor device 100 shown in FIGS. 1A and 1B. This transistor device 1100 incorporates and/or can incorporate many of the feature described above in connection with other implementations.

In this implementation, the end portions 1111A of the trenches 1110 extend beyond and are not disposed below a polysilicon layer 1120. FIG. 11 excludes a polysilicon ring structure. Contact openings 1130B and an active region 1130A (through which one or more metal layers can be contacted) are shown. The contact openings 1130B are open to the polysilicon layer 1120 (and can include poly contacts). The contact openings 1130B are disposed on opposite sides of the trenches 1110. In this implementation, the trenches 1110 include ladder portions. In some implementations, other types of structures can be implemented at the end portions 1111A of the trenches 1110. Although not shown in FIGS. 10A-C and 11, staggered trenches such as 110B (shown in FIGS. 2-3), 410-3 (shown in FIG. 4), and 510-3 (shown in FIG. 5) can be included in the transistor devices 1000 from FIG. 10A-C or 1100 from FIG. 11.

Figure 12A:
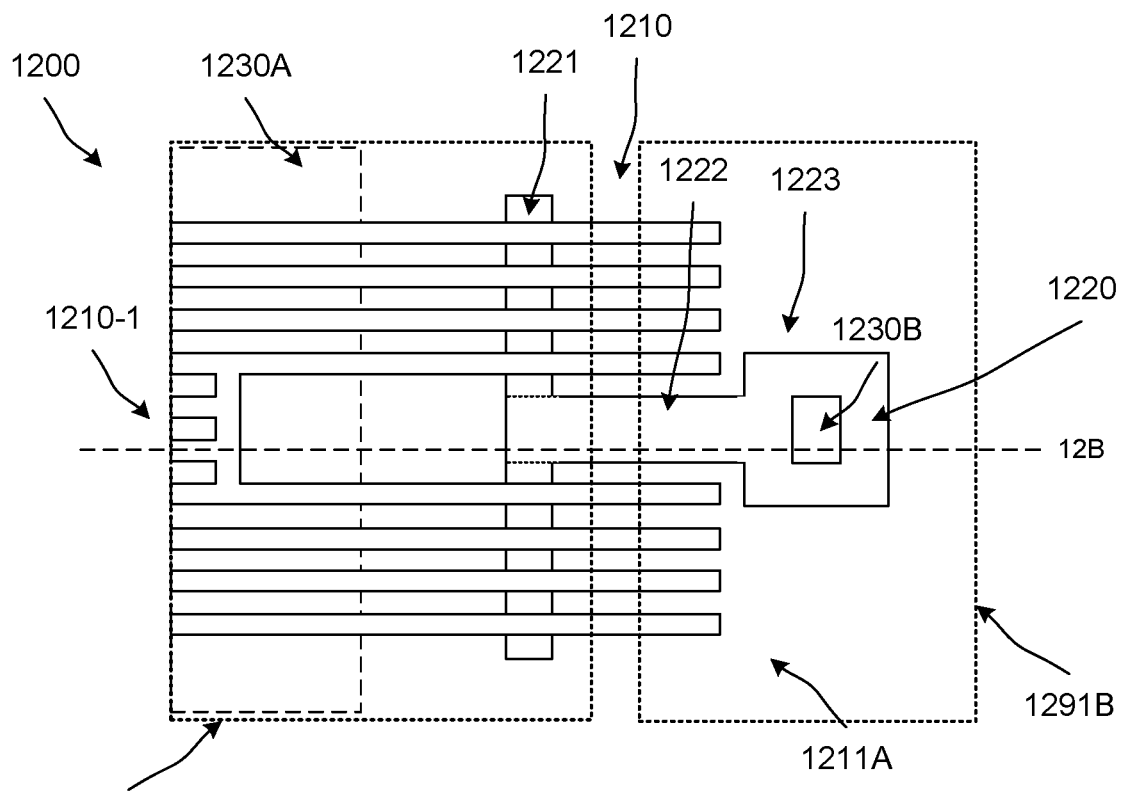
FIGS. 12A through 14D illustrate variations of the transistor devices described herein.

FIG. 12A illustrates a transistor device 1200 that is a variation of the transistor device 100 shown in FIGS. 1A and 1B. This transistor device 1200 incorporates and/or can incorporate many of the feature described above in connection with other implementations. In this implementation, the end portions 1211A of the trenches 1210 extend beyond and are not disposed below a polysilicon layer 1220. Accordingly, FIG. 12A excludes a polysilicon ring structure (in which the trenches 1210 terminate). This implementation includes a contact opening 1230B (through which metal layer 1291B can be contacted) above a portion 1223 of the polysilicon layer 1220 that extends beyond the ends of the trenches 1210. An active region 1230A (through which metal layer 1291A can be contacted) is also shown. In this implementation, the trenches 1210 do not include connecting transverse trenches such as in a ladder portion.

As shown in FIG. 12A, a full polysilicon ring structure is excluded, but a partial ring is formed by a polysilicon runner 1221, a necked portion 1222, and the portion 1223. These elements from a C-shape or define a recessed shaped within which the ends of the trenches 1210 terminate.

In some implementations, other types of structures (e.g., ladder portions) can be implemented at the end portions 1211A of the trenches 1210. As shown in FIG. 12A, the transistor device 1200 includes staggered trenches 1210-1 with an end transverse trench. The staggered trenches 1210-1 can have a different configuration, in some implementations, than that shown in FIG. 12A.

As shown in FIG. 12A, the polysilicon runner 1221 of the polysilicon layer 1220 is configured to be coupled to the electrodes of the trenches 1210. Also, the necked portion 1222 is contiguously coupled between the polysilicon runner 1221 and the portion 1223. In some implementations, the portion 1223 of the polysilicon layer 1220 can be thicker than other portions of the polysilicon layer 1220 (e.g., the necked portion 1222, the polysilicon runner 1221).

Although the contact opening 1230B is disposed above the portion 1223 of polysilicon layer 1220 that extends beyond the ends of the trenches 1210, in some implementations, a contact opening can be disposed above a portion of the polysilicon layer 1220 that is between the trenches 1210 (e.g., does not extend beyond the ends of the trenches 1210). For example, the contact opening can be disposed the necked portion 1222 of the polysilicon layer 1220.

Figure 12B:
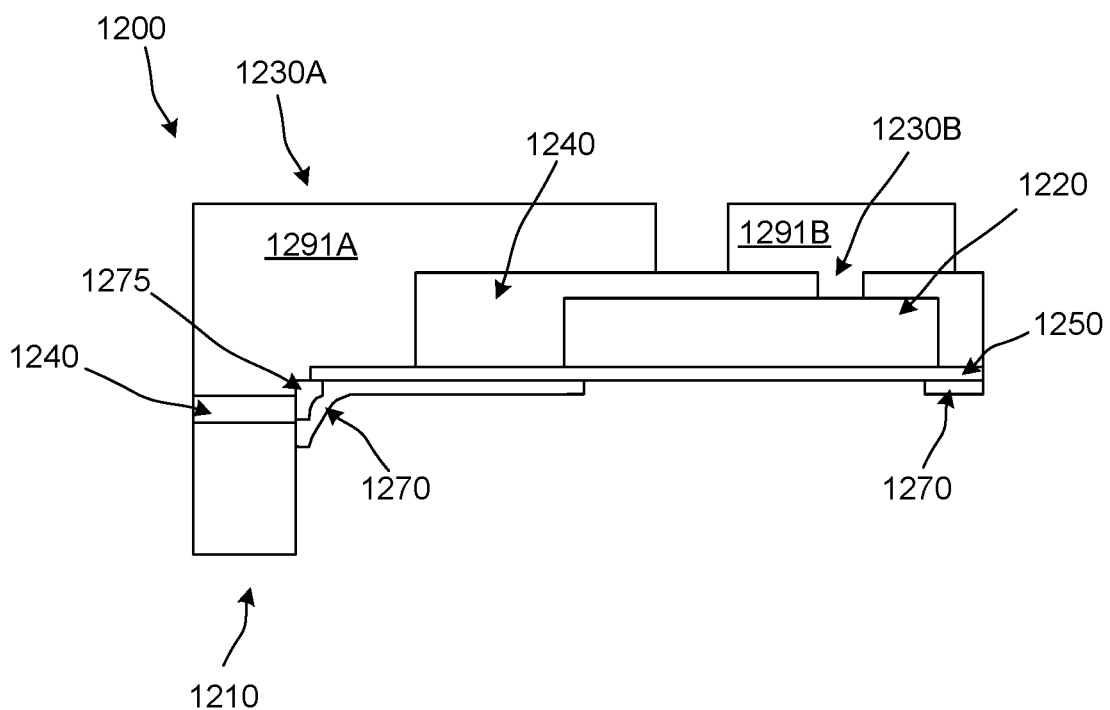

FIG. 12B illustrates a cross-section along line 12B shown in FIG. 12A. FIG. 12B illustrates metal layer 1291B contacted with polysilicon layer 1220 an electrically connected to the polysilicon in the trenches 1210 via the contact opening 1230B. FIG. 12B also illustrates a dielectric layer 1240 and hard mask 1250. A channel implant 1270 (e.g., a channel region) and a source/drain region 1275 are illustrated in FIG. 12B.

Figure 13:
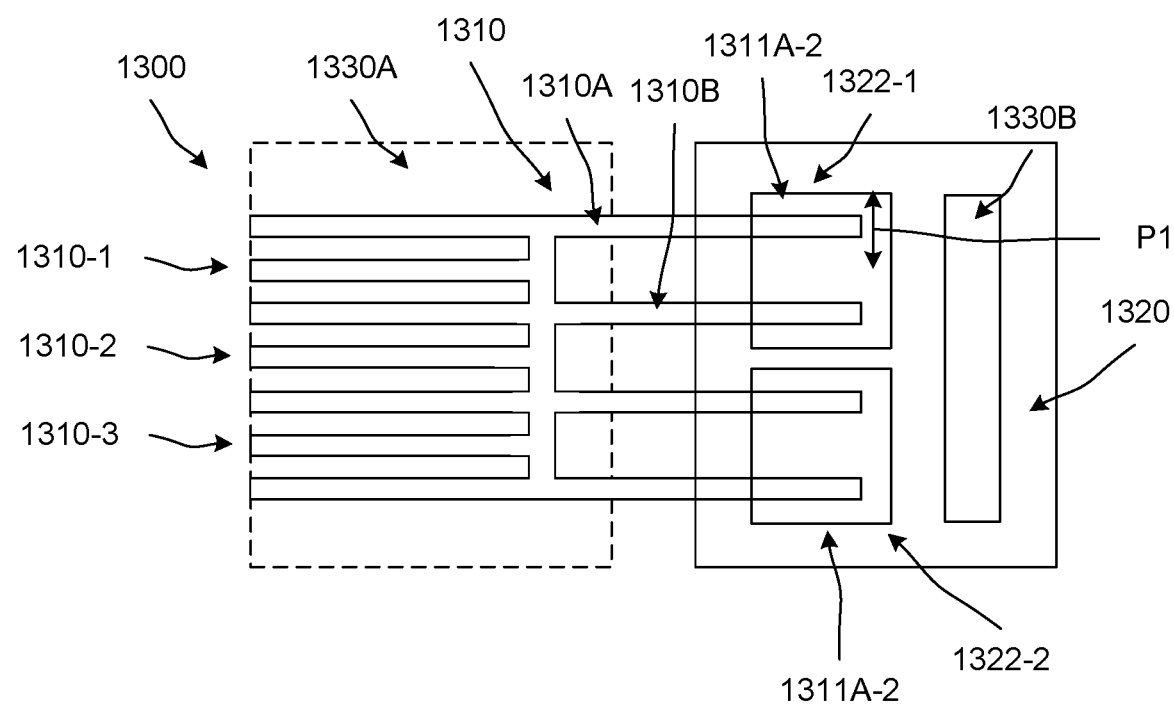

FIG. 13 illustrates a transistor device 1300 that is a variation of the transistor device 100 shown in FIGS. 1A and 1B. This transistor device 1300 incorporates and/or can incorporate many of the feature described above in connection with other implementations. Metal layers, which are included in a fashion similar to the metal layers associated with the other implementations, are not shown in FIG. 13.

In this implementation, the end portions 1311A-1, 1311A-2 of the trenches 1310 are disposed in polysilicon rings 1322-1 and 1322-2. This implementation includes a contact opening 1330B on a portion of polysilicon layer 1320 (which can be disposed on a hard mask (not shown)) that extends beyond the ends of the trenches 1310. An active region 1330A is also shown.

In this implementation, the trenches 1310 are connected in the metal region via staggered trenches 1310-1, 1310-2, 1310-3 so that the number of trenches that terminate in the polysilicon rings 1322-1 and 1322-2 is relatively small (e.g., half or less of the number of parallel trenches 1310, more than half of the number of parallel trenches 1310). Specifically, parallel trenches (e.g., trenches 1310A, 1310B) are separated by staggered trenches (e.g., staggered trench 1310-1). Because, for example, the parallel trenches (or full-length trenches) 1310A, 1310B are separated by the staggered trench 1310-1, the full-length trenches from the parallel trenches 1310 can have ends that are wider along direction P1 (orthogonal to the longitudinal length of the trenches 1310) and can avoid the issues (e.g., GOI issues) described above.

In some implementations, the staggered trenches 1310-1 through 1310-3 can have a different configuration, in some implementations, than that shown in FIG. 13. In some implementations, other types of structures can be implemented at the end portions 1311A-1, 1311A-2 of the trenches 1310.

FIGS. 14A through 14D illustrate a transistor device 1400 that is a variation of the transistor device 100 shown in FIGS. 1A and 1B. The variations in FIGS. 14A through 14D can be implemented in any combination and/or can be combined with the implementations (or features) described above. This transistor device 1400 incorporates and/or can incorporate many of the feature described above in connection with other implementations. The active regions 1440A are shown in FIGS. 14A through 14D. Metal layers, which are included in a fashion similar to the metal layers associated with the other implementations, are not shown in FIGS. 14A through 14D.

Figure 14A:
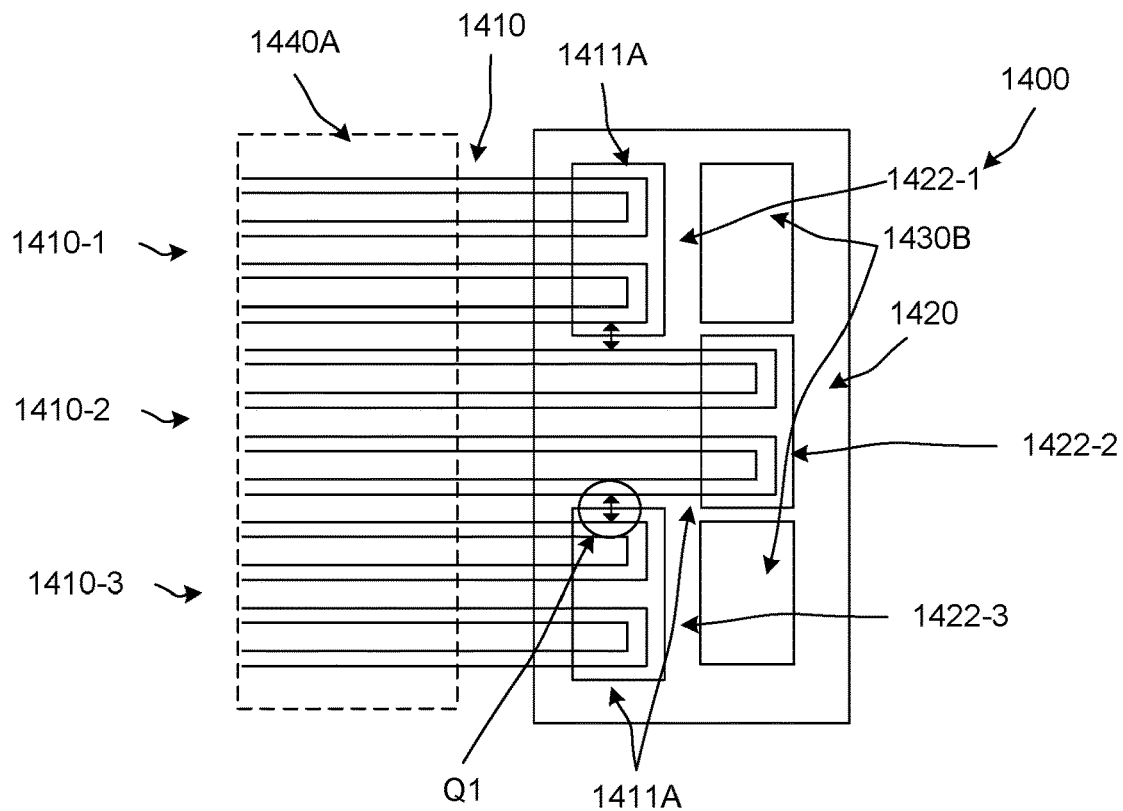

In the implementation shown in FIG. 14A (and in many of the variations), the end portions 1411A of the trenches 1410 (which include trenches 1410-1, 1410-2, 1410-3) are disposed in polysilicon rings that are offset (along a longitudinal length or direction (from left to right of the figure)) within polysilicon layer 1320. Accordingly, the end portions 1411A of the trenches 1410 terminate at different lengths (e.g., trenches 1410-1, 1410-3 are longer or pushed out (full-length) and trenches 1410-2 are shorter or staggered trenches). This implementation includes contact openings 1430B above a portion of the polysilicon layer 1420. The contact openings 1430B are in contact with the polysilicon layer 1420 (via poly contacts), which can be disposed on a hard mask (not shown). The contact openings 1430B are disposed on opposite sides of the trenches 1410-2. In this implementation, each of trenches 1410-1, 1410-2, 1410-3 terminates within a different (and respective) polysilicon ring 1422-1, 1422-2, 1422-3.

In this implementation, the end portions 1411A of pairs of the trenches 1410 are connected with transverse trenches (in a U-shape using transverse end trenches). In some implementations, the end portions 1411A of pairs of the trenches 1410 are not connected with transverse trenches. This implementation can address areas (such as that shown at circle Q1) that can be prone to misalignment in some implementations. In this implementation, T-shaped connections (associated with, for example, staggered trenches between full-length trenches) are avoided, which could result in trenches with different depths and could result in performance issues in some implementations. In some implementations, other types of structures can be implemented at the end portions 1411A of the trenches 1410.

Figure 14B:
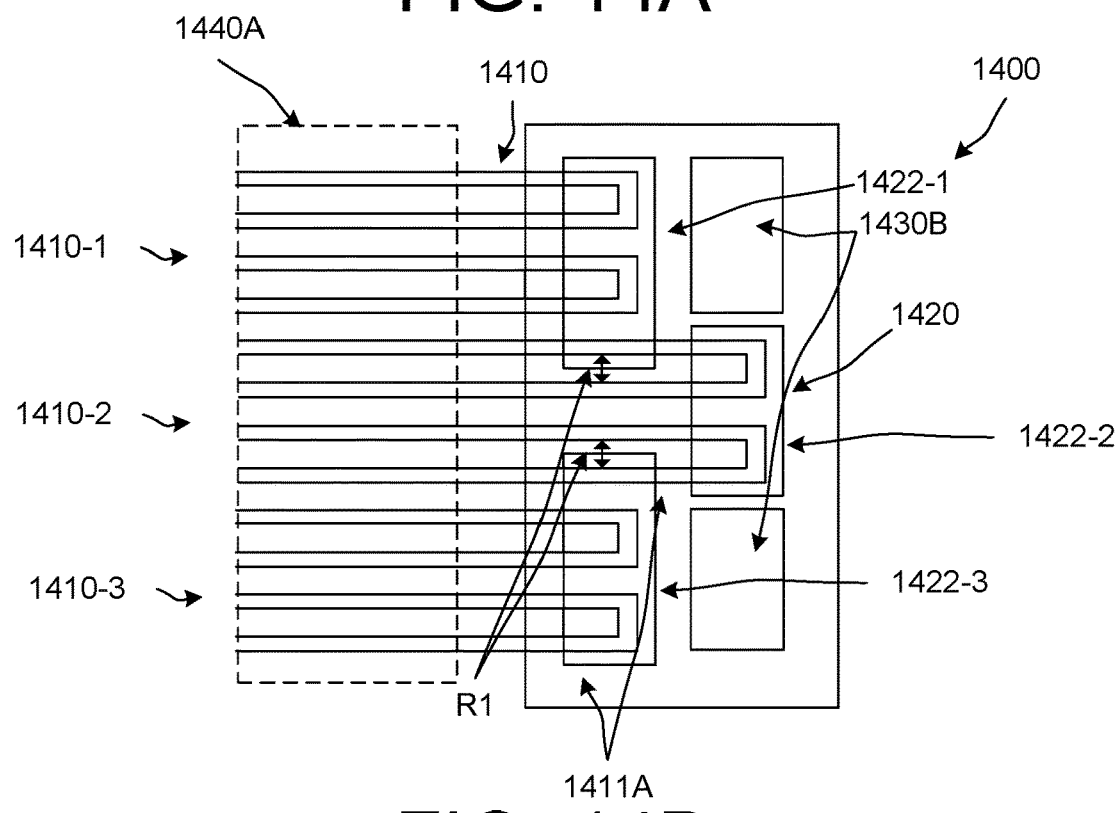

FIG. 14B illustrates a variation of the transistor device 1400 shown in FIG. 14A. In this variation, a polysilicon ring (or rings) is extended above adjacent trenches (as illustrated by the arrows) that do not terminate within the polysilicon ring. For example, at least one of the trenches 1410-2 (which can be referred to as a pass-through trench) extends below the polysilicon ring 1422-1. The at least one trench from the trenches 1410-2 terminates instead within the polysilicon ring 1422-2. The trenches 1410-1 terminate within the polysilicon ring 1422-1. This implementation can further address areas (such as shown by the small double-sided arrows at R1) that can be prone to misalignment in some implementations.

Figure 14C:
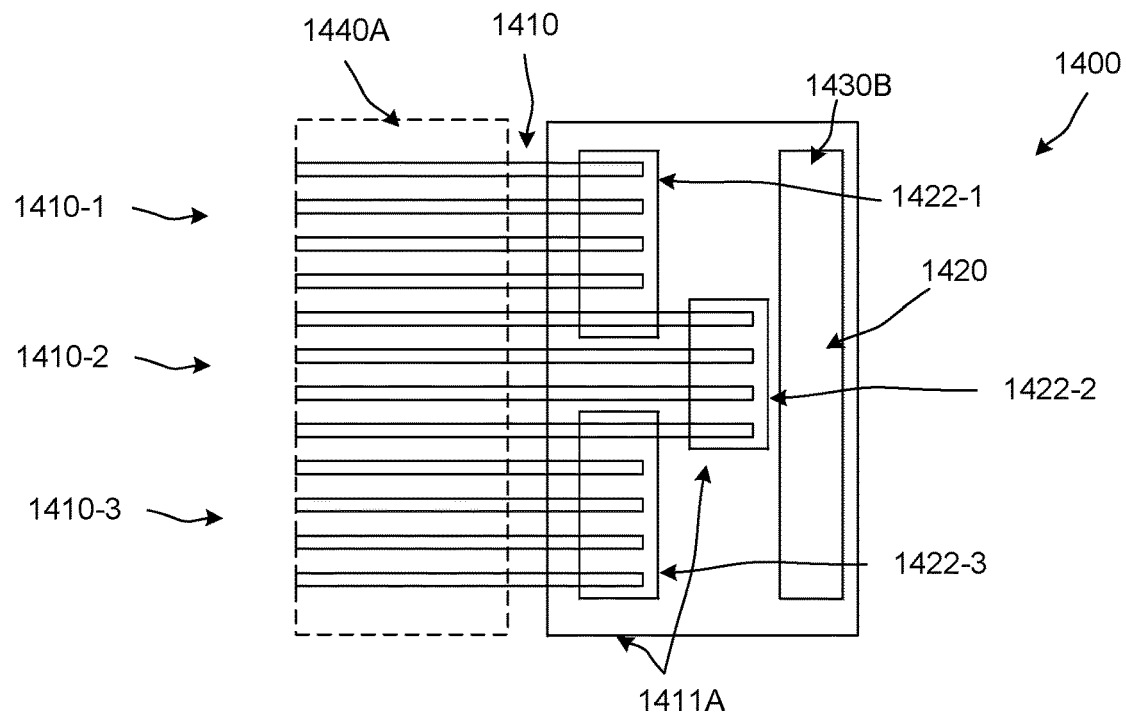

FIG. 14C illustrates a variation of the transistor device 1400 shown in FIGS. 14A and 14B where transverse trenches are excluded. In this implementation, the contact opening 1430B, rather than being divided into multiple contacts, is disposed beyond the ends of the trenches 1410. The contact opening 1430B spans across the distance of the polysilicon rings 1422-1 through 1422-3. Although not shown, in some implementations, this variation can exclude one or more pass-through trenches.

Figure 14D:
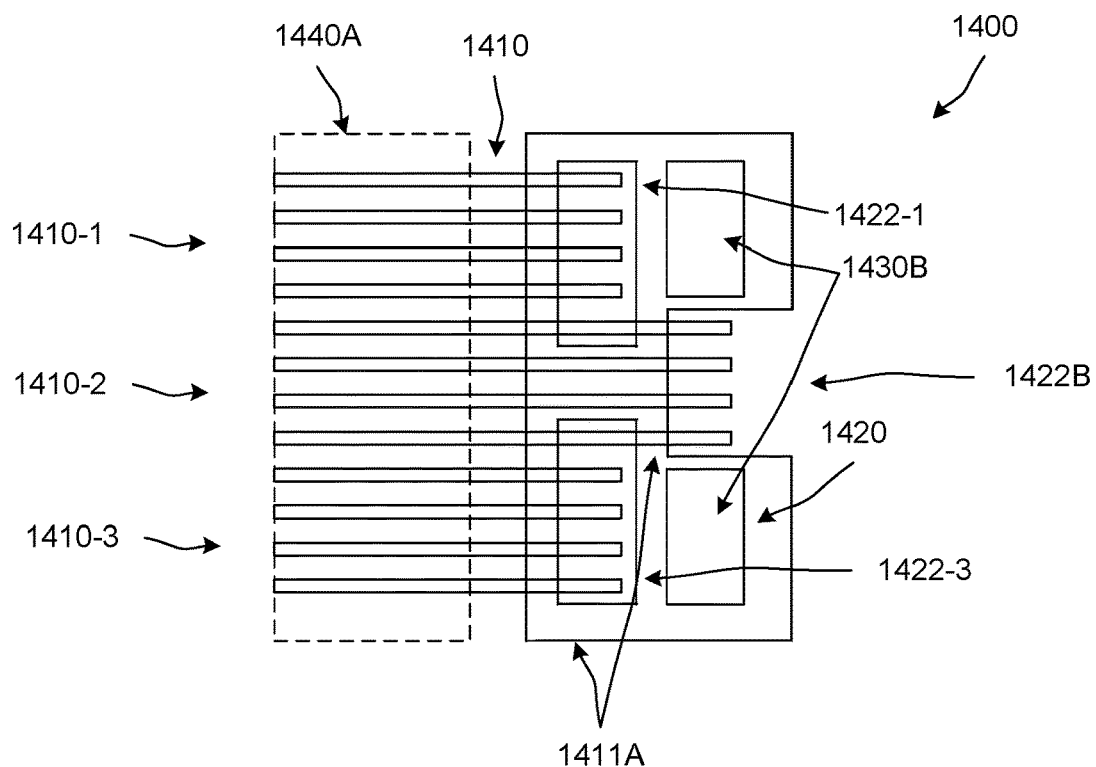

FIG. 14D illustrates a variation of the transistor device 1400 shown in FIGS. 14A through 14C where transverse trenches are excluded and where at least some of the trenches do not terminate within a polysilicon ring (e.g., polysilicon ring 1422-2 from the other implementations is eliminated). Instead, the trenches 1410-2 terminate within a recess 1422B or cavity of the polysilicon layer 1420. In some implementations, other types of structures (e.g., ladder, U-shape, H-shape) can be implemented at the end portions 1411A of at least some of the trenches 1410. Although not shown, in some implementations, this variation can exclude one or more pass-through trenches.

Figure 15:
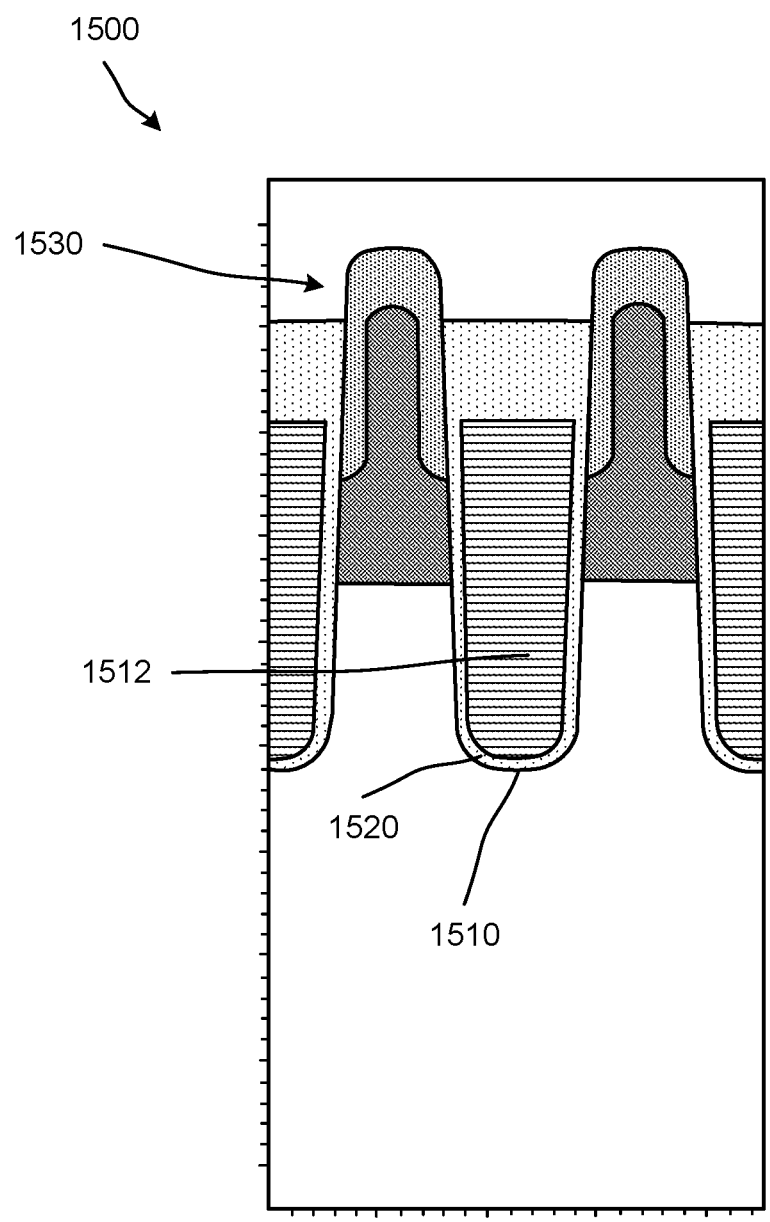
FIG. 15 is a diagram that illustrates a cross-sectional view along trenches of a vertical MOSFET structure that can be implemented in connection with the implementations described herein.

FIG. 15 is a diagram that illustrates a cross-sectional view along trenches of a vertical MOSFET structure 1500 that can be implemented in connection with the implementations described herein. FIG. 15 illustrates a channel and source/drain regions 1530 and a polysilicon gate 1512 disposed within a trench 1510 and lined by a dielectric 1520.

Specific structural and functional details disclosed herein are merely representative for purposes of describing example embodiments. Example embodiments, however, be embodied in many alternate forms and should not be construed as limited to only the embodiments set forth herein.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
   a trench of a transistor device disposed within a semiconductor region of a substrate, the trench being lined with a gate dielectric and including an electrode disposed within the trench, the trench having at least a portion disposed in an active area of the transistor device; and
   a polysilicon layer disposed above the trench, the trench having an end portion disposed in a termination area of the transistor device and disposed below an opening in the polysilicon layer, the end portion of the trench being disposed between a first side of the opening and a second side of the opening.

2. The apparatus of claim 1, wherein the first side of the opening is disposed over a portion of the trench, and the second side of the opening is not disposed over any portion of the trench.

3. The apparatus of claim 1, wherein a third side of the opening is aligned parallel to the trench.

4. The apparatus of claim 1, wherein the trench is a first trench, the apparatus further comprising a second trench having an end portion disposed below the opening in the polysilicon layer.

5. The apparatus of claim 4, further comprising:
   a transverse trench disposed within the opening and aligned orthogonal to and coupled between the first trench and the second trench.

6. The apparatus of claim 4, further comprising:
   a transverse trench disposed within the opening and aligned orthogonal to and coupled between the first trench and the second trench, the first trench having an end section that extends beyond the transverse trench.

7. The apparatus of claim 4, further comprising:
   a transverse trench disposed within the opening and aligned orthogonal to and coupled between the first trench and the second trench, the transverse trench being recessed from an end of the first trench and the second trench.

8. The apparatus of claim 4, further comprising:
   an end transverse trench disposed within the opening and aligned orthogonal to and coupled between the first trench and the second trench.

9. An apparatus, comprising:
   a pair of trenches of a transistor device disposed within a semiconductor region of a substrate, each of the pair of trenches being lined with a gate dielectric and including an electrode disposed within each of the pair of trenches, the pair of trenches each having at least a portion disposed in an active area of the transistor device; and
   a polysilicon layer disposed in a termination area of the transistor device and disposed above the pair of trenches, each of the pair of trenches having an end portion disposed below an opening in the polysilicon layer, the pair of trenches being joined by a transverse trench disposed within the opening.

10. The apparatus of claim 9, wherein the pair of trenches and the transverse trench define an H-shape.

11. The apparatus of claim 9, wherein the pair of trenches and the transverse trench define a portion of a ladder pattern.

12. The apparatus of claim 9, wherein the transverse trench is recessed from an end of each of pair of trenches.

13. The apparatus of claim 9, wherein at least one of the pair of trenches has a tip insulated from the polysilicon layer.

14. The apparatus of claim 9, wherein at least one of the pair of trenches has a tip disposed vertically below the opening.

15. An apparatus, comprising:
   a trench of a transistor device disposed within a semiconductor region of substrate, the trench being lined with a gate dielectric and including an electrode disposed within the trench, the trench having at least a portion disposed in an active area of the transistor device;
   a polysilicon layer disposed above the trench and defining a ring, the ring being disposed in a termination area of the transistor device, the ring having a first portion disposed above and insulated from the trench, the first portion of the ring being disposed on a first side of an end the trench; and
   a contact opening above a second portion of the ring, the second portion of the ring being disposed on a second side of the end of the trench opposite the first side of the end of the trench.

16. The apparatus of claim 15, wherein the first portion of the ring is disposed on one side of an opening within the polysilicon layer, the second portion of the ring is disposed on an opposite side of the opening within the polysilicon layer.

17. The apparatus of claim 15, further comprising:
a metal layer electrically coupled to the second portion of the ring by a contact via the contact opening.

18. The apparatus of claim 15, wherein the second portion of the ring is insulated from a substrate by a dielectric layer.

19. The apparatus of claim 15, wherein the second portion of the ring is insulated from a substrate by a hard mask dielectric layer.

20. The apparatus of claim 15, further comprising a transverse trench disposed within the ring defined within the polysilicon layer and coupled to the trench.

* * * * *